United States Patent [19]
Cherko et al.

[11] Patent Number: 5,935,328
[45] Date of Patent: Aug. 10, 1999

[54] APPARATUS FOR USE IN CRYSTAL PULLING

[75] Inventors: Carl F. Cherko, St. Charles; Harold Korb, Town & Country; Richard G. Schrenker, Chesterfield, all of Mo.; Dick S. Williams, Houston, Tex.

[73] Assignee: MEMC Electronic Materials, Inc., St. Peters, Mo.

[21] Appl. No.: 08/978,334

[22] Filed: Nov. 25, 1997

[51] Int. Cl.$^6$ .................................................. C30B 35/00
[52] U.S. Cl. .......................... 117/218; 117/208; 117/911
[58] Field of Search ................................ 117/14, 15, 35, 117/38, 218, 911, 208

[56] References Cited

U.S. PATENT DOCUMENTS

| | | | |
|---|---|---|---|
| 3,511,609 | 5/1970 | Kato | 117/218 |
| 4,002,523 | 1/1977 | Dyer | 156/617 SP |
| 4,235,848 | 11/1980 | Sokolov et al. | 422/249 |
| 4,301,120 | 11/1981 | Sibley | 117/218 |
| 4,352,785 | 10/1982 | Schellin | 117/218 |
| 4,367,199 | 1/1983 | Jericho | 117/218 |
| 4,722,764 | 2/1988 | Herzer et al. | 156/620.73 |
| 4,916,955 | 4/1990 | Katsuoka et al. | 117/218 |
| 5,106,593 | 4/1992 | Mizuishi et al. | 117/218 |

*Primary Examiner*—Felisa Hiteshew
*Attorney, Agent, or Firm*—Senniger, Powers, Leavitt & Roedel

[57] ABSTRACT

An apparatus for pulling a monocrystalline ingot from a semiconductor source material located within a growth chamber as the ingot is grown on a seed crystal according to the Czochralski method. The apparatus comprises a drum, a chuck constructed for holding the seed crystal and the ingot, and a cable having a first end connected to the drum, a second end connected to the chuck and a portion wound around the drum. The portion of the cable wound around the drum exerts a normal force on a circumferential surface of the drum corresponding to the tension in the cable. The drum and cable interact to produce a friction force resisting sliding movement of the cable relative to the drum in a direction lengthwise of the cable. The drum is capable of unwinding cable from the drum thereby to let out the cable and lower the chuck, and capable of winding the cable around the drum thereby to reel in the cable and draw the chuck upwardly. The chuck has a mass selected to exert a pre-tension on the cable prior to growing the ingot such that the increase in the friction on the portion of the cable wound around the drum as the cable is reeled in to pull the ingot from the source material is at least equal to the increase of the weight of the ingot as it grows on the seed crystal from the molten source material.

19 Claims, 3 Drawing Sheets

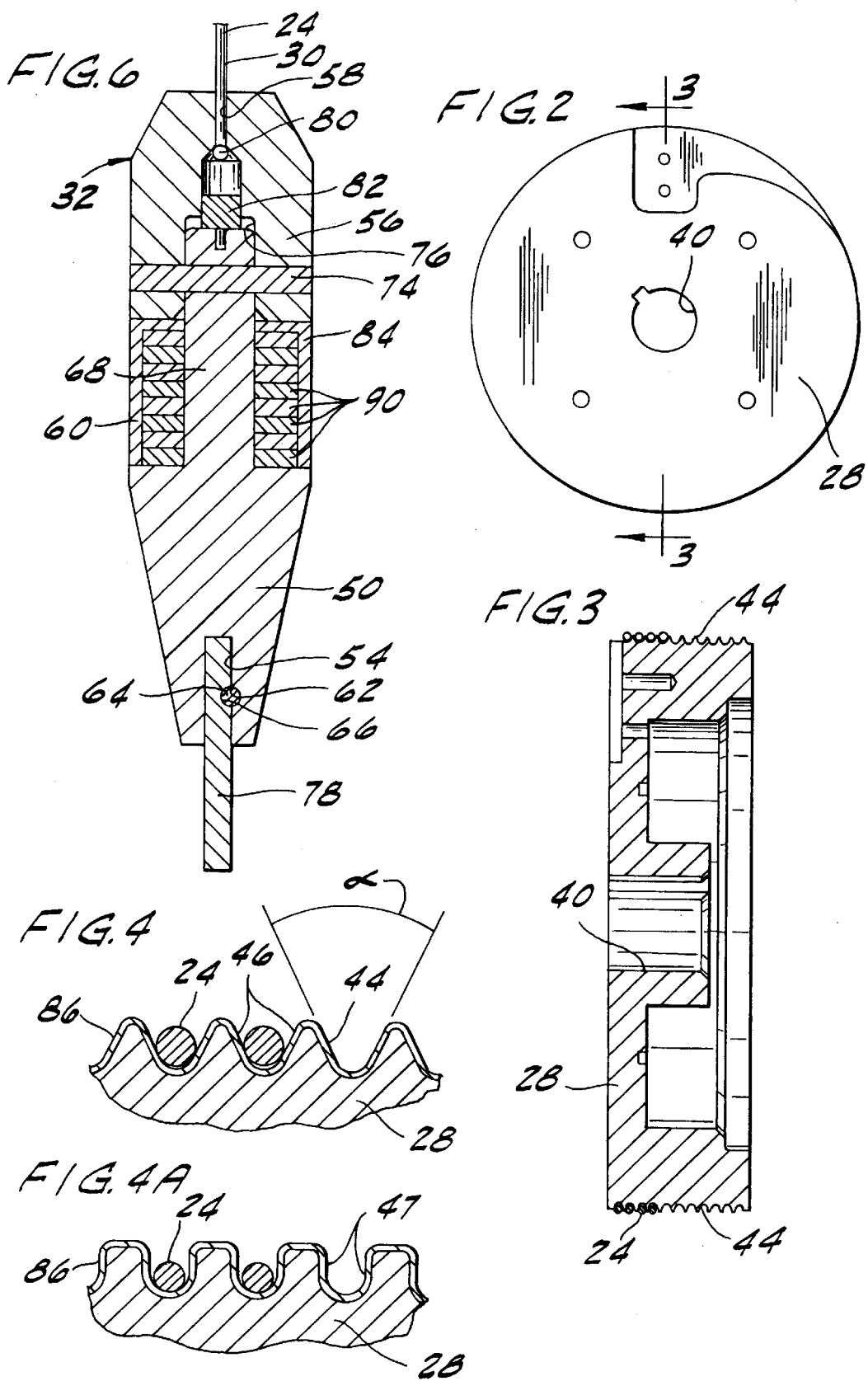

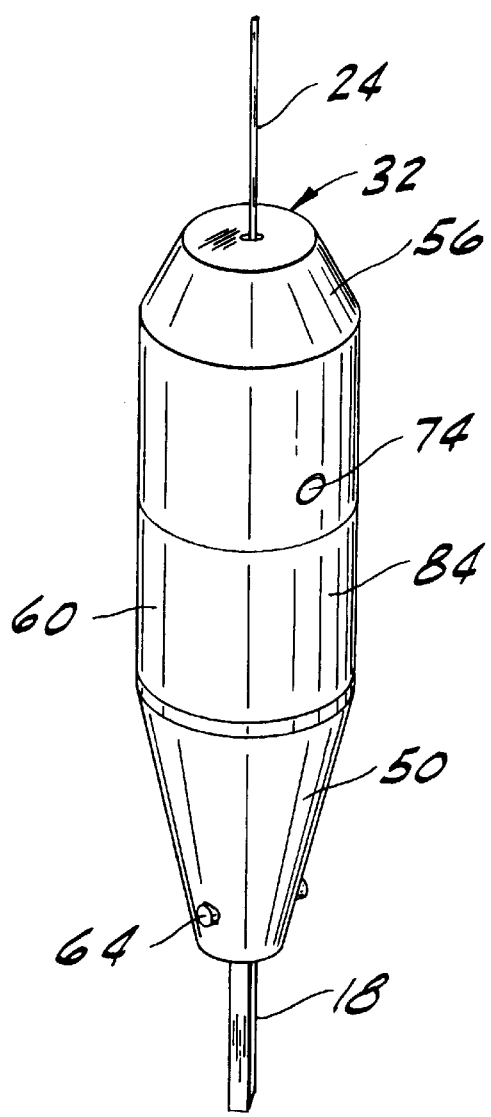
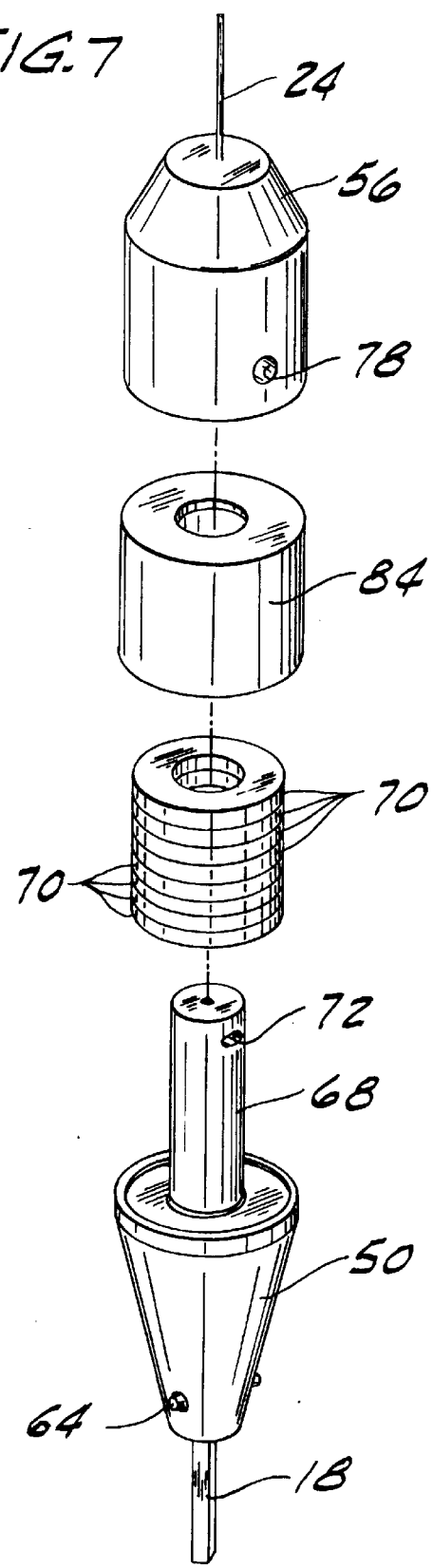

5,935,328

APPARATUS FOR USE IN CRYSTAL PULLING

BACKGROUND OF THE INVENTION

This invention relates generally to devices for use in crystal growth by the Czochralski method, and more particularly, to an apparatus for pulling the crystal from semiconductor source melt.

In operation of the Czochralski method of single crystal growth, a quantity of source material is formed in a crucible by melting solid semiconductor source material maintained in an inert environment. A crystal is attached to a cable and lowered into the melted source material. As the crystal grows on the seed it is slowly pulled from the melt.

The cable is typically wrapped around a drum which is rotated to slowly pull the crystal from the melt as it grows. As the weight of the crystal increases the tension on the cable increases. If the rate at which the crystal weight and cable tension increases is greater than the rate at which reactive friction forces between the cable and drum are generated, the cable will momentarily slip on the drum until the tension load created in the cable wrapped on the drum combined with the friction force is at least equal to the increase in the weight of the crystal and equilibrium is established. When this slip occurs, the crystal drops into the source material melt and creates a splash wave on the melt surface. The lowering of the crystal back into the source material melt and the wave on the melt surface may cause a loss of zero dislocation structure in the crystal. After a first dislocation is formed in the crystal it can multiply, generating numerous dislocations which spread out into the crystal. Therefore, if a dislocation-free growing crystal is disturbed at one point by slipping of the cable on the drum, the whole cross section and a considerable part of the already grown crystal may be inundated with dislocations.

SUMMARY OF THE INVENTION

Among the several objects of the invention may be noted the provision of an apparatus which inhibits slipping of a cable wrapped around a drum used in pulling crystals from source material melt to provide smooth and continuous pulling of the crystal from the melt; the provision of such an apparatus which reduces the likelihood of dislocations being formed in the crystal; the provision of such an apparatus which is easily incorporated into existing pulling devices; and the provision of such an apparatus which is easy to use and economical to manufacture.

Apparatus of the present invention pulls a monocrystalline ingot from a semiconductor source material located within a growth chamber as the ingot is grown on a seed crystal according to the Czochralski method. Generally, the apparatus comprises a drum mounted for rotation about an axis and a chuck constructed for holding the seed crystal and the ingot grown on the seed crystal from the source material. The apparatus further comprises a cable having a first end connected to the drum, a second end connected to the chuck and a portion wrapped around the drum. The portion of the cable wrapped around the drum exerts a normal force on a circumferential surface of the drum corresponding to the tension in the cable. The drum and cable interact to produce a friction force resisting sliding movement of the cable relative to the drum in a direction lengthwise of the cable. The drum is capable upon rotation in a first direction of unwinding cable from the drum thereby to let out the cable and lower the chuck, and capable upon rotation in a second direction opposite the first direction of winding more of the cable around the drum thereby to reel in the cable and draw the chuck upwardly. The chuck has a mass selected to exert a pre-tension on the cable prior to growing the ingot such that the increase in the friction on the portion of the cable wound around the drum as the cable is reeled in to pull the ingot from the source material is at least equal to the increase of the weight of the ingot as it grows on the seed crystal from the molten source material whereby the cable does not slip on the drum as the ingot is grown.

In another aspect of the present invention apparatus pulls a monocrystalline ingot from a semiconductor source material located within a growth chamber as the ingot is grown on a seed crystal according to the Czochralski method. Generally, the apparatus comprises a drum mounted for rotation about an axis and a chuck constructed for holding the seed crystal and the ingot grown on the seed crystal from the source material. The apparatus further comprises a cable having a first end connected to the drum, a second end connected to the chuck and a portion wrapped around the drum. The portion of the cable wrapped around the drum exerts a normal force on a circumferential surface of the drum corresponding to the tension in the cable. The drum and cable interact to produce a friction force resisting sliding movement of the cable relative to the drum in a direction lengthwise of the cable. The drum is capable upon rotation in a first direction of unwinding cable from the drum thereby to let out the cable and lower the chuck, and capable upon rotation in a second direction opposite the first direction of winding more of the cable around the drum thereby to reel in the cable and draw the chuck upwardly. At least a portion of a surface of the drum in contact with the cable has a surface finish providing an increase in friction between the cable and the drum as the cable is reeled in to pull the ingot from the source material which is at least equal to the increase of the weight of the ingot as it grows on the seed crystal from the molten source material.

Other objects and features of the present invention will be in part apparent and in part pointed out hereinafter.

BRIEF DESCRIPTION OF THE DRAWINGS

FIG. 2 is a side view of a cable drum of the apparatus of FIG. 1;

FIG. 3 is a cross-sectional view taken through and including line 3—3 of FIG. 2;

FIG. 4 is an enlarged fragmentary view of the cable drum of FIG. 3 showing cable received in grooves in the drum;

FIG. 4A is an enlarged fragmentary view of the cable drum showing cable received in grooves having generally parallel side walls.

FIG. 5 is an elevational view of a seed chuck of the pulling apparatus of FIG. 1 holding a seed crystal and connected to a cable;

FIG. 6 is a cross-sectional view of the seed chuck of FIG. 5; and

FIG. 7 is an exploded view of the seed chuck of FIG. 5.

Corresponding reference characters indicate corresponding parts throughout the several views of the drawings.

DESCRIPTION OF THE PREFERRED EMBODIMENT

Figure 1:
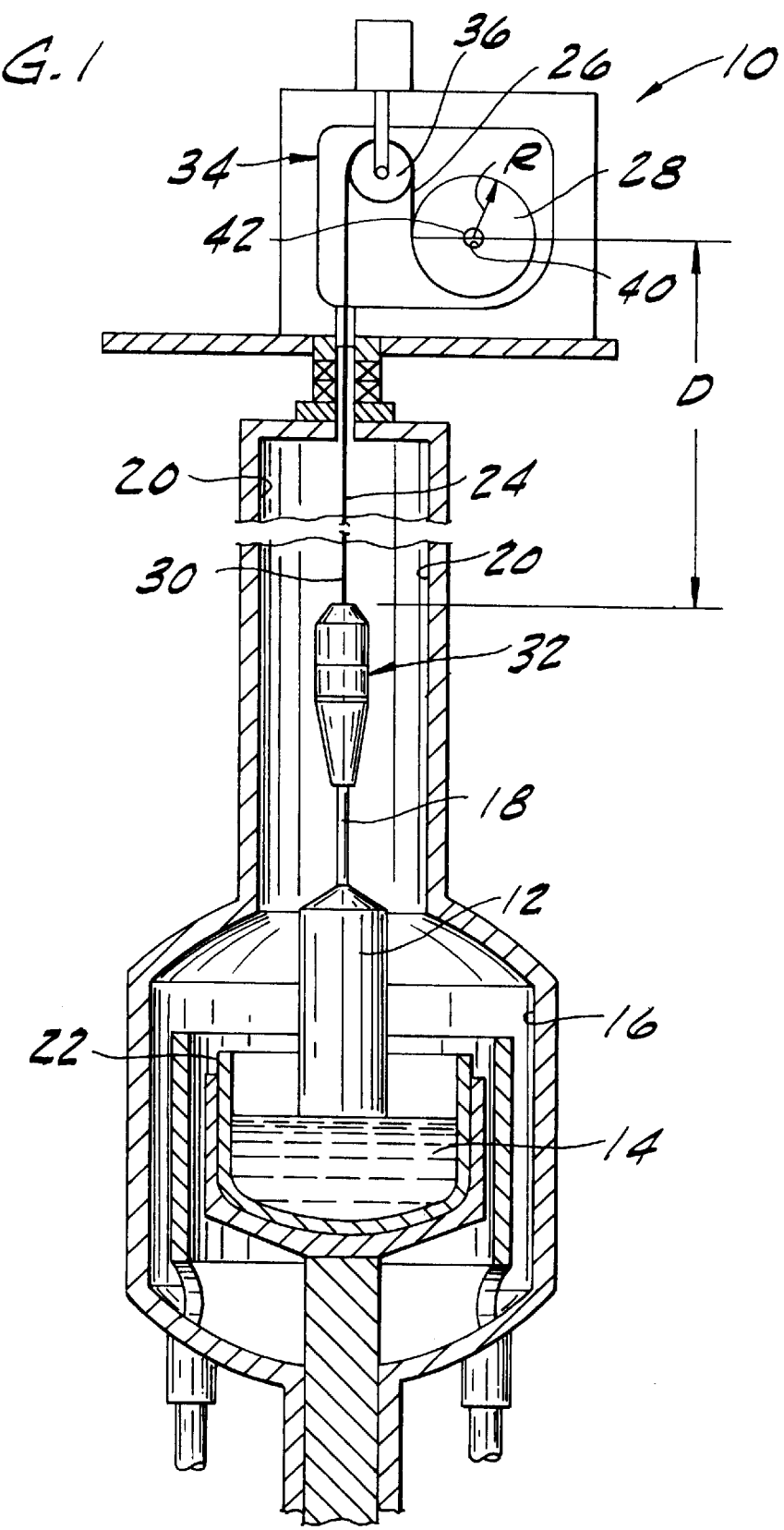
FIG. 1 is a schematic cross-sectional view of pulling apparatus of the present invention.

Referring now to the drawings, and first to FIG. 1, an apparatus of the present invention is generally indicated at 10. The apparatus 10 is used for pulling a monocrystalline ingot 12 from a semiconductor source material 14 located within a growth chamber 16 as the ingot is grown on a seed crystal 18 by the Czochralski method. The crystal pulling apparatus 10 is shown in FIG. 1, the details of its construction being well known to those of ordinary skill in the art. Generally, the crystal pulling apparatus 10 includes a pulling chamber 20, the growth chamber 16, and a crucible 22 located in the growth chamber for holding the source material 14. The pulling apparatus 10 includes a cable 24 having a first end 26 connected to a drum 28 and a second end 30 connected to a chuck, generally indicated at 32, constructed for holding the seed crystal 18 and the ingot 12 grown on the seed crystal from the source material.

The pulling apparatus 10 includes a winch assembly, generally indicated at 34, operable to let out and reel in the cable 24 for lowering the seed crystal 18 into the source material 14 and pulling the ingot 12 grown on the seed crystal from the source material. The winch assembly 34 includes a drum 28 mounted for rotation about an axis and a pulley 36 having a grooved rim. The cable 24 may also be wrapped directly around the cable drum 28 without the use of a pulley 36 as is well known by those skilled in the art. The drum 28 has an opening 40 extending generally through its center for mounting the drum on a shaft 42 (FIGS. 1 and 2). A portion of the cable 24 is wound around the drum 28 in grooves 44 formed in the circumference of the drum (FIG. 3). The cable 24 is then trained around an upper portion of the pulley 36 which is mounted generally adjacent to the drum 28 with its center of rotation located slightly above the center of rotation of the drum (FIG. 1). The drum 28 is operable upon rotation in a first direction to unwind cable 24 from the drum thereby to let out the cable and lower the chuck 32, thus lowering the seed crystal 18 into the melt 14. Upon rotation in a second direction opposite the first direction, the drum 28 is operable to wind the cable 24 around the drum thereby to reel in the cable and draw the chuck 32 upwardly to remove the ingot 12 from the melt 14. The drum 28 may be driven in a suitable manner such as by a motor (not shown), for example.

The portion of the cable 24 wound around the drum 28 exerts a normal force, i.e., a force at right angles to the tangent to the drum at a point on the circumferential surface of the drum, corresponding to the tension in the cable. The drum 28 and cable 24 interact to produce a friction force equal to the normal force on the drum multiplied by the static coefficient of friction between the cable and drum. The friction force resists sliding movement of the cable 24 relative to the drum 28 in a direction lengthwise of the cable. As the ingot 12 grows from the seed crystal 18, the weight of the ingot and the tension it creates in the cable 24 increases as the cable is wound on the drum 28. If the rate at which the weight of the ingot 12 and corresponding cable tension increases is greater than the rate at which the friction force between the cable 24 and drum 28 increases, the cable will momentarily slip on the drum until the tension load created by the friction force is at least equal to the load on the cable created by the increase in weight of the ingot. To prevent the cable 24 from slipping on the drum 28, the friction force must be sufficient to create a tension in the cable which is always equal to or greater than the opposing tension load in the cable created by the weight of the ingot 12. In order to increase the friction force, the normal force exerted by the cable 24 wound around the drum 28 or the static coefficient of friction between the cable and the drum must be increased. If the friction force is greater than the load created by the weight of the ingot 12, the cable 24 and drum 28 can react to the added load as the ingot is grown and prevent the cable from slipping on the drum.

One way to increase the friction force between the drum 28 and cable 24 is to increase the tension load on the cable prior to winding the cable on the drum. The weight of the chuck 32 may be increased to exert a pretension on the cable 24 prior to growing the ingot 12 such that the increase in the friction force between the cable 24 and drum 28 as the cable is reeled in to pull the ingot from the molten source material 14 is at least equal to the increase of the weight of the ingot as it grows on the seed crystal 18 from the source material. In order to provide a pre-tension on the cable 24 sufficient to provide an increase in friction force which is at least equal to the increase in weight of the ingot 12, the mass of the chuck 32 should be at least equal to:

$$R*(dM/dL)/\mu$$

wherein:
R=radius of the drum;
dM/dL=rate of increase in the mass of the ingot per change in length of the cable, the length of the cable being defined as a vertical distance D between an upper end of the chuck and a point of contact between the cable and drum; and
$\mu$=static coefficient of friction between the cable and drum.

For example, an ingot 12 having a final diameter of 200 mm has a rate of increase in ingot mass per length of the cable (dM/dL) of about 0.88 kg/cm. If the ingot 12 is grown in a pulling apparatus 10 having a drum 28 with a radius of 7.62 cm, and a static coefficient of friction between the drum and cable 24 of 0.30, the minimum total chuck 32 mass to prevent cable slippage is about 23 kg.

The above equation is for use with a drum groove 44 having a radius slightly larger than the cable 24 diameter. The shape of the groove 44 may be modified to increase the friction force created between the cable 24 and groove. As shown in FIG. 4, the groove has diverging side walls 46 which form a generally V-shaped groove. For a drum 28 having a groove 44 with angled side walls 46, the mass of the chuck 32 should be at least equal to:

$$R*(dM/dL)*(\sin{(\alpha/2)})/\mu$$

wherein:
R=radius of the drum;
dM/dL=rate of increase in the mass of the ingot per change in length of the cable, the length of cable being defined as a vertical distance D between an upper end of the chuck and a point of contact between the cable and drum;
$\alpha$=angle between the side walls of the groove;
$\mu$=static coefficient of friction between the cable and the drum.

As the angle $\alpha$ between the side walls 46 becomes more acute and approaches small values, the minimum weight of the chuck 32 is reduced. As will be noted by the above equation, as the angle a between the side walls 46 approaches 180 degrees, the sine term approaches one and the above equation reduces to the previous equation which can be used to calculate the minimum chuck 32 weight required for a round groove having generally parallel side walls 47 (FIG. 4A).

The chuck 32 is configured for receiving additional weight so that the total mass of the chuck can be increased to a predetermined value according to the above equations. The chuck 32 comprises a lower portion 50 having a seed opening 54 for receiving a portion of the seed crystal 18, an upper portion 56 having an opening 58 for receiving the cable 24, and a central portion 60 for receiving additional weight (FIGS. 5 and 6). The lower portion 50 of the chuck 32 is generally conical shaped with a truncated bottom and has a hole 62 extending generally perpendicular to the seed opening 54 for receiving a pin 64 for locking the seed crystal 18 in place (FIG. 5). The seed crystal 18 has a notch 66 formed therein for engagement with the pin 64 to hold the seed crystal within the chuck 32. The pin 64 allows for easy removal and replacement of the seed crystal 18 after the ingot 12 is grown. It is to be understood that the seed crystal 18 may be held in the chuck 32 by other means without departing from the scope of this invention.

A stem 68 extends generally upwardly from the lower portion 50, through the central portion 60 and into the upper portion 56 of the chuck 32. The stem 68 is configured for receiving weight in the form of rings 70 for increasing the overall mass of the chuck 32 (FIGS. 6 and 7). A hole 72 extends generally transversely through the stem 68 for receiving a pin 74 for connecting the lower and upper portions 50, 56 of the chuck 32. The upper portion 56 of the chuck 32 includes a cavity 76 for receiving the stem 68 and an opening 78 extending transversely through the cavity for alignment with the hole 72 in the stem 68 for receiving the pin 74. A ball 80 is attached to the end of the cable 24 after it is inserted through the opening 58 in the upper portion 56 of the chuck 32 to hold the cable 24 within the chuck (FIG. 6). An insulator 82 is located in the upper portion 56 of the chuck 32 between the cable 24 and the stem 68 to thermally protect the cable from heat transferred through the stem from exposure of the lower portion 50 of the chuck to the heated source material melt 14 (FIGS. 1 and 6). The lower portion 50 of the chuck 32 is preferably formed from graphite. The upper portion 56 of the chuck 32 is preferably formed from quartz but both the lower and upper portion may be formed from other suitable materials such as molybdenum, tungsten or tantalum, without departing from the scope of this invention.

The rings 70 are preferably formed from a refractory metal, such as molybdenum, tantalum or tungsten, which is suitable for use within a crystal growth chamber 16 environment. It is to be understood that the number and size of the rings 70 and the type of material of the rings may be other than shown or described above without departing from the scope of this invention. For example, one large ring (not shown) may be used.

A tubular shield 84 is located between the lower and upper portions 50, 56 of the chuck 32 for enclosing the rings 70 (FIGS. 6 and 7). The shield 84 is preferably formed from graphite or other suitable material which will react with oxygen surrounding the refractory metal rings 70 to form a protective layer of carbon monoxide or carbon dioxide. This protective layer prevents reaction between oxygen and the molybdenum rings 70 when the growth chamber 16 is opened and the rings are still at a temperature sufficient to allow reaction between the molybdenum and the oxygen. The shield 84 may be eliminated if the crystal growing process is modified and controlled such that the rings are not exposed to any reactive combination of temperature and gases.

As discussed above, the friction force may also be increased by increasing the static coefficient of friction between the cable 24 and drum 28 (FIG. 1). The static coefficient of friction is increased so that when the cable 24 is reeled in to pull the ingot 12 from the source material 14, the increase in friction between the cable and drum is at least equal to the increase of the weight of the ingot as it grows on the seed crystal 18 from the molten source material. The friction may be increased by placing a friction enhancing coating 86 on the surface of the grooves 44 of the drum 28 in contact with the cable 24 to provide a surface finish having an increased static coefficient of friction (FIGS. 1 and 4). A plasma spray coating 86 such as tungsten carbide or chromium carbide may be deposited on the drum groove 44 to increase the static coefficient of friction between the cable 24 and drum 28, thus reducing the minimum total weight required for the chuck 32. The use of a coating 86 will also improve the durability and wear resistance of the groove surfaces. Other friction enhancing coatings may also be applied or the groove surface may be machined to have a rough surface finish to increase the static coefficient of friction between the cable 24 and drum 28.

As described above, the friction force created between the cable 24 and drum 28 may be increased by increasing the mass of the chuck 32, or by increasing the static coefficient of friction between the cable and drum by applying friction enhancing coatings 86 to the drum. These changes to the pulling apparatus may be used alone or in combination to provide sufficient friction force to prevent the cable 24 from slipping in the drum 28 due to the increased weight of the ingot as the ingot 12 is grown on the seed crystal 18.

On start up of the crystal growth process, the melt of semiconductor source material 14 in the crucible 22 is first formed by stacking solid semiconductor source material such as polysilicon chunks in the quartz crucible (FIG. 1). Heating elements (not shown) are activated to melt the solid source material. The drum 28 is rotated in a clockwise direction (as viewed in FIG. 1) to let out the cable 24, lower the chuck 32 and dip the seed crystal 18 into the melted source material 14 until the seed crystal begins to melt itself. The drum 28 is then rotated in a counterclockwise direction to reel in the cable 24 and withdraw the seed crystal 18 from the melt 14. The diameter of the ingot 12 is gradually increased by decreasing the pulling rate, the melt temperature, or both. A cylindrical part of the ingot 12 is grown with a constant diameter by controlling the pulling rate or the melt temperature or both while compensating for the decrease in the level of the melted source material. The melt temperature is controlled toward the end of the growing of the ingot 12 to form an end-cone at the end of the ingot before the crucible 22 is completely empty of source material 14. The friction force between the cable 24 and drum 28 prevents slipping of the cable, thus providing smooth and continuous pulling of the crystal from the melt throughout the growing process.

It will be observed from the foregoing that the pulling apparatus 10 of the present invention has numerous advantages. Importantly, the pulling apparatus 10 prevents slipping of the cable 24 and ingot 12 as the ingot is pulled from the source material 14, thus preventing a splash wave on the melt surface of the source material which typically results in a loss of zero dislocation structure compromising crystal quality and production.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. An apparatus for pulling a monocrystalline ingot from a semiconductor source material located within a growth chamber as the ingot is grown on a seed crystal according to the Czochralski method, the apparatus comprising:

a drum mounted for rotation about an axis;

a chuck constructed for holding the seed crystal and the ingot grown on the seed crystal from the source material; and a cable having a first end connected to the drum, a second end connected to the chuck and a portion wound around the drum, the portion of the cable wound around the drum exerting a normal force on a circumferential surface of the drum corresponding to the tension in the cable, the drum and cable interacting to produce a friction force resisting sliding movement of the cable relative to the drum in a direction lengthwise of the cable, the drum being capable upon rotation in a first direction of unwinding cable from the drum thereby to let out the cable and lower the chuck, and capable upon rotation in a second direction opposite the first direction of winding more of the cable around the drum thereby to reel in the cable and draw the chuck upwardly;

the chuck having a mass selected to exert a pre-tension on the cable prior to growing the ingot such that the increase in the friction on the portion of the cable wound around the drum as the cable is reeled in to pull the ingot from the source material is at least equal to the increase of the weight of the ingot as it grows on the seed crystal from the molten source material whereby the cable does not slip on the drum as the ingot is grown.

2. An apparatus as set forth in claim 1 wherein the mass of the chuck is at least equal to:

$$R*(dM/dL)/\mu$$

wherein:
R=radius of the drum;
dM/dL=rate of increase in the mass of the ingot per change in length of the cable, the length of the cable being defined as a vertical distance between an upper end of the chuck and a point of contact between the cable and drum; and
$\mu$=static coefficient of friction between the cable and drum.

3. An apparatus as set forth in claim 2 wherein the chuck comprises a lower end having an opening therein for receiving a portion of the seed crystal, an upper end having an opening for receiving the cable, and a central portion, the apparatus further comprising a weight receivable on the central portion for increasing the mass of the chuck.

4. An apparatus as set forth in claim 3 wherein the chuck further comprises a stem extending through the central portion of the chuck and wherein the weight comprises a ring sized and shaped for placement on the stem.

5. An apparatus as set forth in claim 4 wherein the weight comprises plural rings.

6. An apparatus as set forth in claim 4 wherein the ring is formed from a refractory metal.

7. An apparatus as set forth in claim 4 further comprising a shield for covering the ring.

8. An apparatus as set forth in claim 7 wherein the shield is formed from graphite.

9. An apparatus as set forth in claim 1 wherein the drum has a groove formed in the circumference thereof, the portion of the cable being disposed within the groove.

10. An apparatus as set forth in claim 9 wherein the surface of the groove has a friction enhancing coating to increase the static coefficient of friction between the cable and the drum.

11. An apparatus as set forth in claim 10 wherein the friction coating is selected from a group including a plasma spray tungsten carbide coating and a plasma spray chromium coating.

12. An apparatus as set forth in claim 9 wherein the groove is defined by diverging side walls which form a generally V-shaped groove.

13. An apparatus as set forth in claim 12 wherein the mass of the chuck is at least equal to:

$$R*(dM/dL)*(\sin(\alpha/2))/\mu$$

wherein:

R=radius of the drum;
dM/dL=rate of increase in the mass of the ingot per change in length of the cable, the length of cable being defined as a vertical distance between an upper end of the chuck and a point of contact between the cable and drum;
$\alpha$=angle between the side walls of the groove;
$\mu$=static coefficient of friction between the cable and the drum.

14. An apparatus for pulling a monocrystalline ingot from a semiconductor source material located within a growth chamber as the ingot is grown on a seed crystal according to the Czochralski method, the apparatus comprising:
a drum mounted for rotation about an axis;
a chuck constructed for holding the seed crystal and the ingot grown on the seed crystal from the source material; and
a cable having a first end connected to the drum, a second end connected to the chuck and a portion wound around the drum, the portion of the cable wound around the drum exerting a normal force on a circumferential surface of the drum corresponding to the tension in the cable, the drum and cable interacting to produce a friction force resisting sliding movement of the cable relative to the drum in a direction lengthwise of the cable, the drum being capable upon rotation in a first direction of unwinding cable from the drum thereby to let out the cable and lower the chuck, and capable upon rotation in a second direction opposite the first direction of winding more of the cable around the drum thereby to reel in the cable and draw the chuck upwardly;
at least a portion of a surface of the drum in contact with the cable having a surface finish providing an increase in friction between the cable and the drum as the cable is reeled in to pull the ingot from the source material which is at least equal to the increase of the weight of the ingot as it grows on the seed crystal from the molten source material whereby the cable does not slip on the drum as the ingot is grown.

15. An apparatus as set forth in claim 14 wherein the drum has a groove formed in the circumference thereof, the portion of the cable being disposed within the groove.

16. An apparatus as set forth in claim 15 wherein the groove is defined by diverging side walls which form a generally V-shaped groove.

17. An apparatus as set forth in claim 15 wherein the surface of the groove has a friction enhancing coating to increase the static coefficient of friction between the cable and the drum.

18. An apparatus as set forth in claim 17 wherein the friction coating is selected from a group including a plasma spray tungsten carbide coating and a plasma spray chromium carbide coating.

19. An apparatus as set forth in claim 14 wherein the mass of the chuck is at least equal to:

$$R*(dM/dL)/\mu$$

wherein:
R=radius of the drum;
dM/dL=rate of increase in the mass of the ingot per change in length of the cable, the length of the cable being defined as a vertical distance between an upper end of the chuck and a point of contact between the cable and drum; and
$\mu$=static coefficient of friction between the cable and drum.

* * * * *